United States Patent [19]
Horner et al.

[11] Patent Number: 5,242,641
[45] Date of Patent: Sep. 7, 1993

[54] METHOD FOR FORMING FILLED HOLES IN MULTI-LAYER INTEGRATED CIRCUIT PACKAGES

[75] Inventors: James W. Horner; Gordon O. Zablotny, both of San Diego, Calif.

[73] Assignee: Pacific Trinetics Corporation, San Marcos, Calif.

[21] Appl. No.: 729,649

[22] Filed: Jul. 15, 1991

[51] Int. Cl.$^5$ .......................... B28B 1/48; B29C 67/08
[52] U.S. Cl. .................... 264/104; 264/156; 264/163; 425/113; 425/290
[58] Field of Search .............. 264/104, 272.11, 272.17, 264/259, 156, 154, 155, 163; 425/113, 127, 129.1, 290, 299

[56] References Cited
U.S. PATENT DOCUMENTS
4,519,760  5/1985  Norell .................................. 425/113

*Primary Examiner*—Jan H. Silbaugh
*Assistant Examiner*—Angela Ortiz
*Attorney, Agent, or Firm*—Brown, Martin, Haller & McClain

[57] ABSTRACT

In an apparatus for forming filled via holes in ceramic substrates or wafers, upper and lower masks or dies each having at least one hole are clamped between opposing injection and base members with a wafer placed between the masks. The injection member has an injection chamber containing conductive ink material which is connected with the or each hole in the upper mask. An injection device such as a piston is used to force ink out of the chamber through the or each hole in the adjacent mask, punching one or more plugs of wafer material out of the wafer and replacing each punched-out plug with ink material, the plugs being pushed into the or each aligned hole in the other mask, which acts as a stripper. In one version, each die has a single hole and filled holes are formed sequentially at successive points on the wafer. In an alternative, each die or mask has a plurality of holes and the filled holes are formed simultaneously.

5 Claims, 3 Drawing Sheets

METHOD FOR FORMING FILLED HOLES IN MULTI-LAYER INTEGRATED CIRCUIT PACKAGES

BACKGROUND OF THE INVENTION

The present invention relates generally to the manufacturing of multi-layer ceramic integrated circuit packages for the electronics industry, and is particularly concerned with the stage in manufacturing at which holes are formed in a predetermined pattern in ceramic layers and filled with ink.

Integrated circuit packages are made from several flat layers of ceramic. Conductive paths are provided between successive layers by means of aligned holes, known as via holes, which are filled with conductive ink or paste.

The packages are fabricated by first punching the desired hole pattern into a flat ceramic wafer, and subsequently filling the punched holes with conductive ink. The desired conductor pattern is then screen printed onto the surface of the wafer. The multiple layers that make up the package are then stacked together and laminated together under high pressure to produce a composite laminated structure.

Currently, various techniques are used to fill the formed via holes. In one example, a mask having holes corresponding to those in the wafer is placed over the wafer with the holes in alignment. Ink is then spread over the mask with a squeegee device which presses ink through the mask into the wafer. This technique can cause some spreading of ink around the via holes.

Another method for filing via holes is described in U.S. Pat. No. 4,519,760 of Norell. In this method, a wafer having pre-formed holes is placed on a base. A hollow member having an open face covered by a mask with holes corresponding to those in the wafer is placed over the base. A diaphragm filled with conductive ink is located in the hollow member, and pressure is applied to the diaphragm to force ink out through the mask holes and into the holes of the wafer. One problem with this is that the holes in the mask must be properly aligned with the holes in the wafer for complete filling to occur.

SUMMARY OF THE INVENTION

It is an object of this invention to provide a new and improved method and apparatus for forming and filling via holes in ceramic wafers.

According to one aspect of the present invention, an apparatus is provided for forming filled via holes in a flat wafer, comprising a base member and an opposing upper, injection member, the members having opposing, upper and lower dies each having at least one hole aligned with a corresponding hole in the other die, and a clamping mechanism for releasably clamping the upper and base members together with a wafer sandwiched between the upper and lower dies. The injection member has an injection chamber connected to the hole in the upper die and containing conductive ink material. An injection device is provided for forcing the ink material out of the injection chamber and through the hole in the upper die to punch a corresponding hole in the wafer or ceramic sheet, forcing a plug of the wafer material into the aligned hole in the lower die and replacing the plug with conductive ink material.

In one embodiment of the invention, filled holes are formed one at a time in this way, and the wafer or ceramic sheet is moved automatically from to align successive points on the wafer with the hole forming and filling apparatus by a suitable transport mechanism under the control of a suitably programmed computer, forming a filled via hole at each point before moving to the next point, until a predetermined pattern of filled via holes is formed on the wafer. Alternatively, the apparatus may be moved from point-to-point across the wafer. The injection device may comprise a suitable piston or pressurized fluid for forcing conductive ink material out of the chamber.

In an alternative embodiment, the upper and lower dies comprise masks each having a plurality of holes in a predetermined matching pattern, and the wafer or ceramic sheet is clamped between the masks with the holes in the masks aligned. The upper mask is secured across an open end of the injection chamber.

In this way, holes are formed in the wafer and filled with conductive ink simultaneously in a one step procedure, rather than the two steps which were previously necessary. With this apparatus, the ink itself acts as a punch to force ceramic into the holes in the lower mask, which acts as a stripper. Thus, it is not necessary to pre-form holes in the wafer before ink is injected, and the problems of aligning such pre-formed holes accurately with the holes in the mask is eliminated. A force of the order of 30,000 p.s.i. must be applied in order to drive the conductive ink material, which is in the form of a paste, through the underlying wafer, where all the holes are formed and filled simultaneously. This may be achieved by connecting the injection chamber to a source of pressurized air or hydraulic fluid, with the ink contained in a flexible bladder or diaphragm within the chamber. In this case, the clamping mechanism must be capable of withstanding such pressures safely. Alternatively, the injection device may comprise a piston which is forced down in the chamber by means of a hammer or an hydraulic press acting on the piston. Conventional hydraulic presses are available which can withstand such pressures. Where the filled via holes are formed one at a time via tooling with the ceramic sheet moving to align successive points with the tooling, as discussed above, less force will be needed to form and fill the via holes, allowing the mechanism to be used even for very large ceramic sheets, for example of the order of 10" by 10".

According to another aspect of the present invention, a method of forming filled via holes in a flat wafer or workpiece comprises the steps of placing the wafer between upper and lower masks or dies each having at least one hole of predetermined via dimensions, clamping the masks and sandwiched wafer together between opposing injection and base members, the injection member having an injection chamber which communicates with the or each hole in the upper mask or die, and forcing conductive ink material out of the injection chamber through the hole or holes in the upper mask and through the underlying wafer to force a plug of wafer material into the or each aligned hole in the lower mask, simultaneously forming a conductive ink filled hole in the wafer.

In this way, via holes can be formed and filled with ink simultaneously in ceramic layers for forming multi-layer integrated circuit packages, requiring only a one step process rather than two separate steps. This reduces manufacturing expense and complexity, since there is no need for alignment of any holes in the wafer prior to the ink injection as was previously required.

Another advantage is that the holes can be formed and completely filled with ink more reliably than was previously possible.

BRIEF DESCRIPTION OF THE DRAWINGS

The present invention will be better understood from the following detailed description of some preferred embodiments, taken in conjunction with the accompanying drawings in which like references refer to like parts and in which.

DESCRIPTION OF THE PREFERRED EMBODIMENTS

Figure 1:
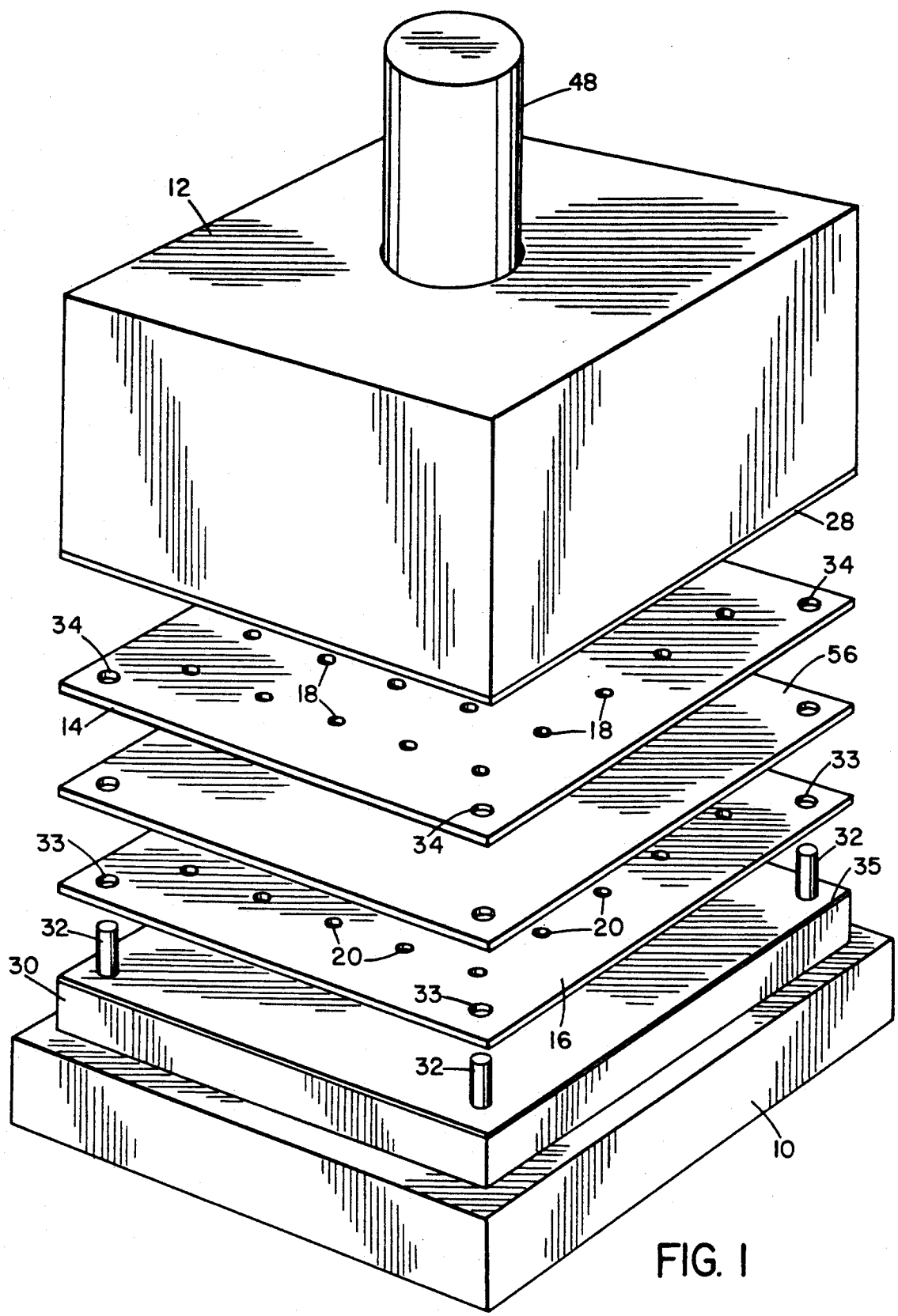
FIG. 1 is an exploded perspective view of apparatus for forming filled via holes according to a first embodiment of the present invention.
Figure 3:
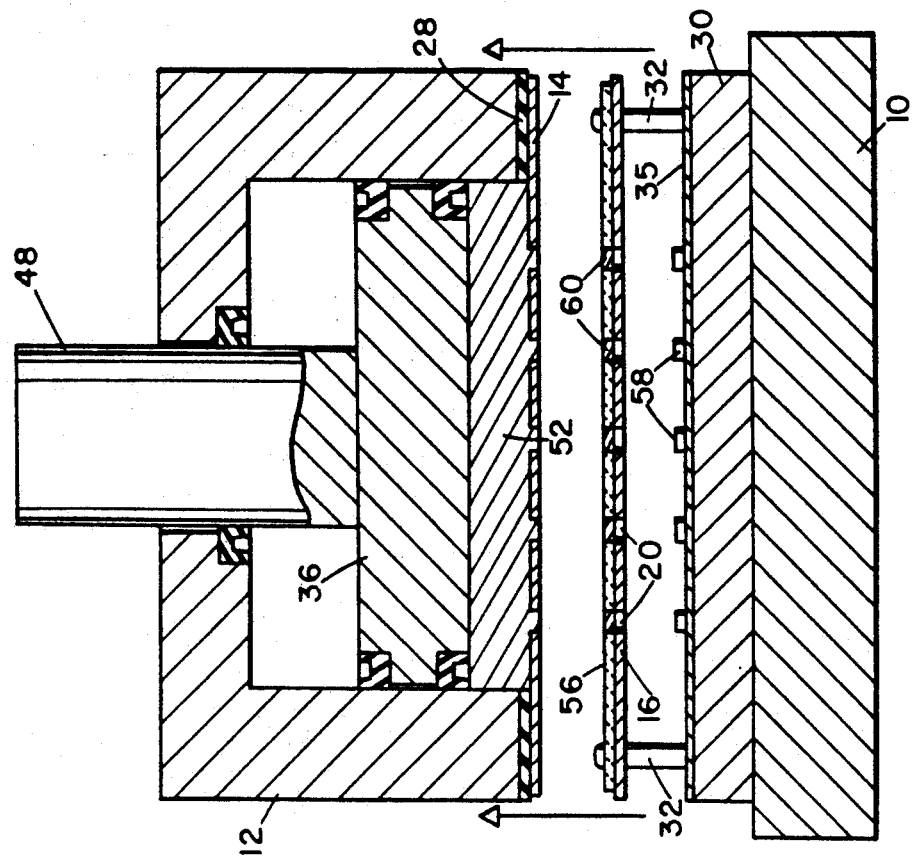
FIG. 3 is a cross-section similar to FIG. 2 but with the parts separated immediately after forming the filled via holes.
Figure 2:
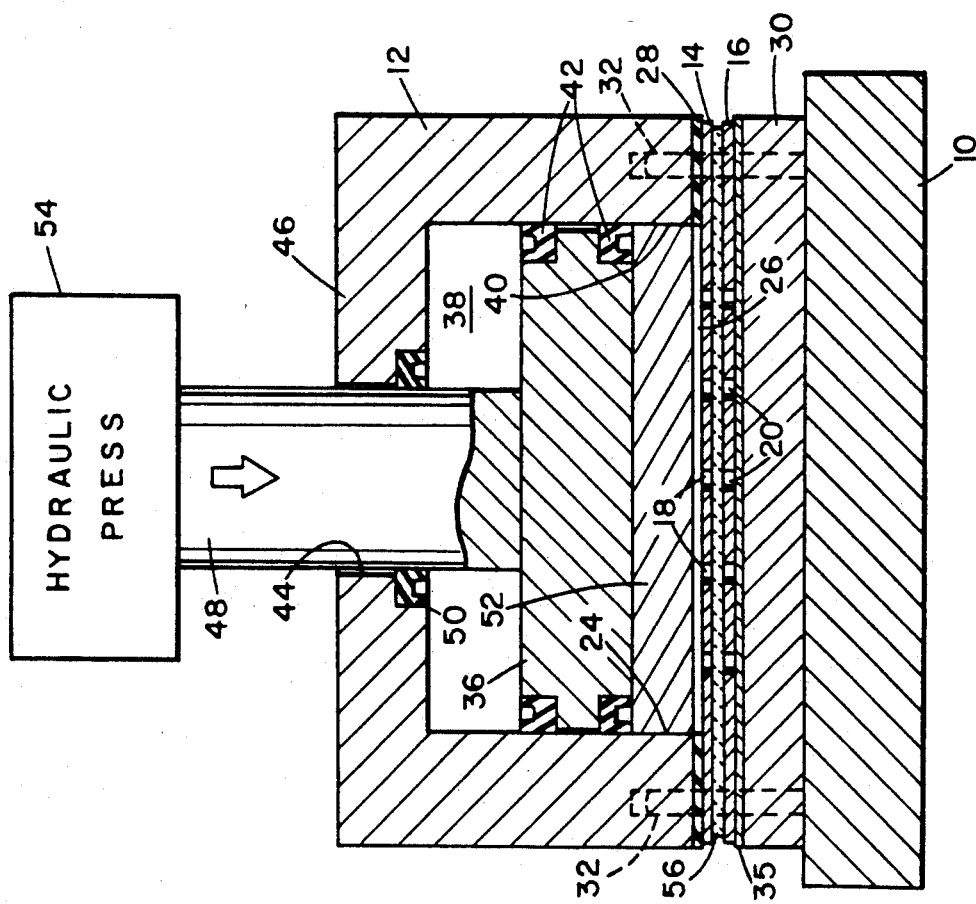
FIG. 2 is a cross-section on lines 2—2 of FIG. 1 with the parts of the apparatus clamped together prior to forming the filled via holes.

FIGS. 1 to 3 illustrate a first embodiment of an apparatus and method for forming filled via holes in ceramic tape wafers or hybrid circuit substrates as used in making multi-layer integrated circuit packages. The apparatus basically comprises a base member 10 and an opposing, injection member 12 with a pair of masks 14, 16 having matching, aligned holes 18, 20 located between the members 10 and 12. The upper, injection member 12 has an injection chamber 24 with an open end 26 facing downwardly, and the upper mask is secured across the open end 26 of the injection chamber with an annular or peripheral seal member 28 between the mask 14 and injection member 12. The lower mask 16 is supported on a flat supporting platform 30 of the base member, with alignment posts 32 projecting upwardly from platform 30 through alignment holes 33, 34 provided on the masks 16, 14 to maintain the mask holes 18, 20 in proper alignment. A sheet of paper 35 or other absorbent material is placed on platform 30 underlying the lower mask 16.

A piston member 36 is slidably mounted in the injection chamber 24, dividing the chamber into separate upper and lower parts or cavities 38, 40. Annular O-ring seals 42 on the piston member are sealing engagement with the surrounding wall of chamber 24 to provide a seal between the cavities 38 and 40. Piston 36 has a reduced diameter stem or shaft 48 projecting outwardly through bore 44 in the upper end wall 46 of injection member 12. An annular O-ring seal 50 surrounds the stem 48 to seal the cavity 38. The lower cavity 40 contains a high viscosity conductive ink 52 of the type used in manufacturing multilayer integrated circuit packages, for example tungsten, gold or silver ink. These inks are typically in the form of a thixotropic thick film paste which will not leak out of the openings in mask 14. A suitable force applying mechanism 54 such as a hammer or hydraulic press applies downward force to hold the injection member down and apply pressure to the projecting end of the piston stem 48.

The apparatus is operated by first placing a sheet or wafer 56 of ceramic material having no holes between the upper and lower mask. The masks and wafer are then securely clamped between the upper and base members by the hydraulic press, as illustrated in FIG. 2. At this point, the force applying mechanism 54 is activated to apply downward pressure on piston member 36, pushing the member 36 downwardly and forcing ink out of the cavity 40 through the holes in mask 14. As the ink is driven out through the holes in mask 14, it acts as a punch to force out plugs 58 of ceramic material from wafer 56 into the aligned openings in lower mask 16, which acts as a stripper extruding out the plugs 58, as indicated in FIG. 3. Thus, holes 60 are formed in wafer 56 by the ink material itself, which simultaneously fills the holes as it is forming them. The paper sheet below the lower mask catches the extruded plugs 58 when the parts are subsequently separated, as in FIG. 3. The wafer with filled via holes 60 is then removed and transported to the next stage in the overall manufacturing process, and replaced with the next blank ceramic wafer to be processed. When a different via hole pattern is needed, the upper and lower masks are simply removed and replaced with a new pair of masks both carrying the desired via hole pattern. The downward pressure applied by mechanism 54 is of the order of 30,000 p.s.i. in order to drive the ink through the ceramic wafer. Standard hydraulic presses are known which can operate at this order of pressure.

This method reduces the number of stages, and the number of separate machines, required to form filled via holes from two to one, with a consequent reduction in processing time, expense, and complexity. There is no need for accurate alignment of the wafer, since it carries no pre-formed via holes, and thus set up of the machine prior to operation is simplified, since the wafer is simply placed between the masks.

Figure 4:
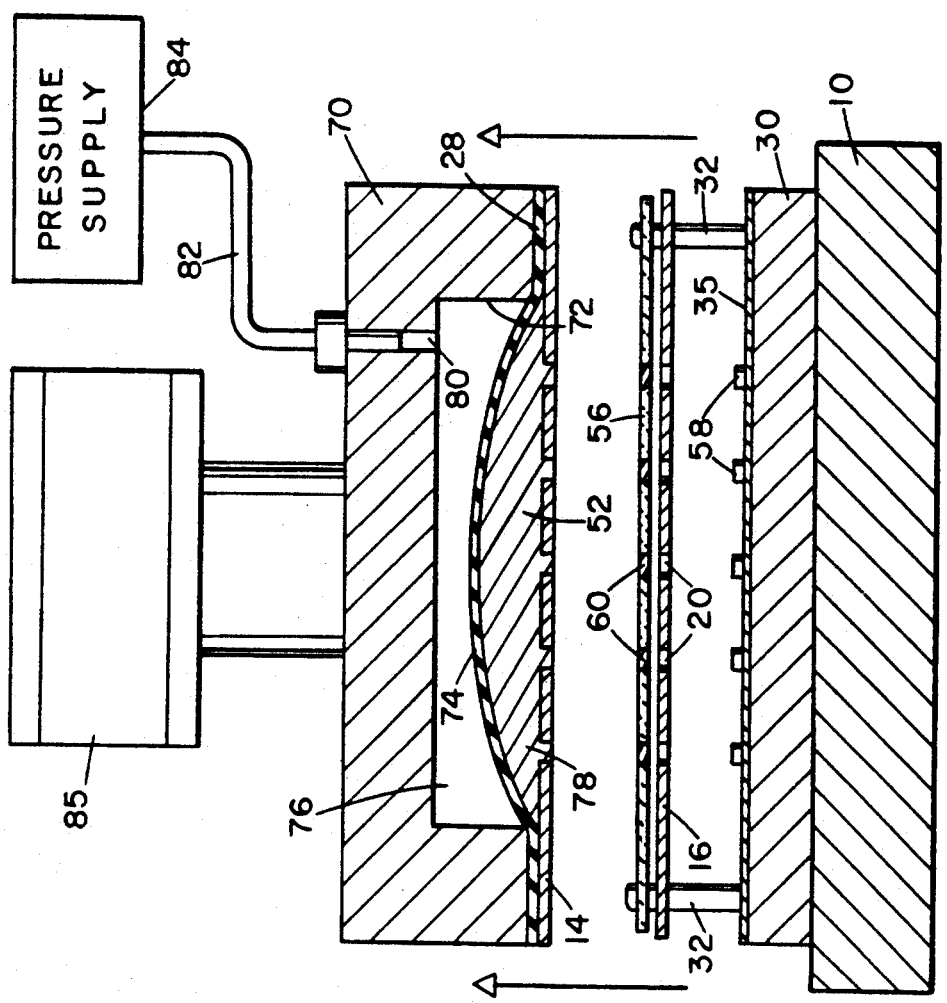
FIG. 4 is a view similar to FIG. 3 illustrating an alternative embodiment of the invention.

FIG. 4 illustrates a modified embodiment of the invention. In this embodiment, the base and mask parts of the apparatus are similar to those in FIGS. 1 to 3, and like reference numerals have been used where appropriate. However, in this embodiment the upper injection member 70 has an injection chamber 72 with an elastic bladder or diaphragm 74 dividing the chamber into separate upper and lower cavities 76, 78, the lower cavity 78 containing a conductive ink paste. The upper cavity 76 is connected via pressure inlet or injection port 80 to a pressure hose 82, which in turn is connected to a supply 84 of pressurized air or fluid.

A clamping mechanism 85 such as a hydraulic cylinder assembly as illustrated in FIG. 4 is operatively connected to injection member 70 to move it up and down between its released position illustrated in FIG. 4 and an operative position in which wafer 56 is clamped between the injection and base members as in FIG. 2 of the previous embodiment.

Operation of this embodiment is much the same as the first embodiment. A wafer 56 is simply placed between the upper and lower masks before clamping the assembly together with clamping mechanism 85. Pressurized fluid is then supplied to the upper cavity 76. The pressurized fluid forces the diaphragm downwardly into cavity 78, squeezing ink out of the cavity through the holes in upper mask. The ink punches plugs 58 of ceramic out of the wafer into the aligned holes in lower mask, leaving ink-filled via holes 60 in the wafer in the desired pattern.

With this arrangement, as noted above, a two stage procedure requiring two separate machines is reduced to one stage. Additionally, the filled via holes are formed much more accurately and are completely filled with ink.

Figure 5:
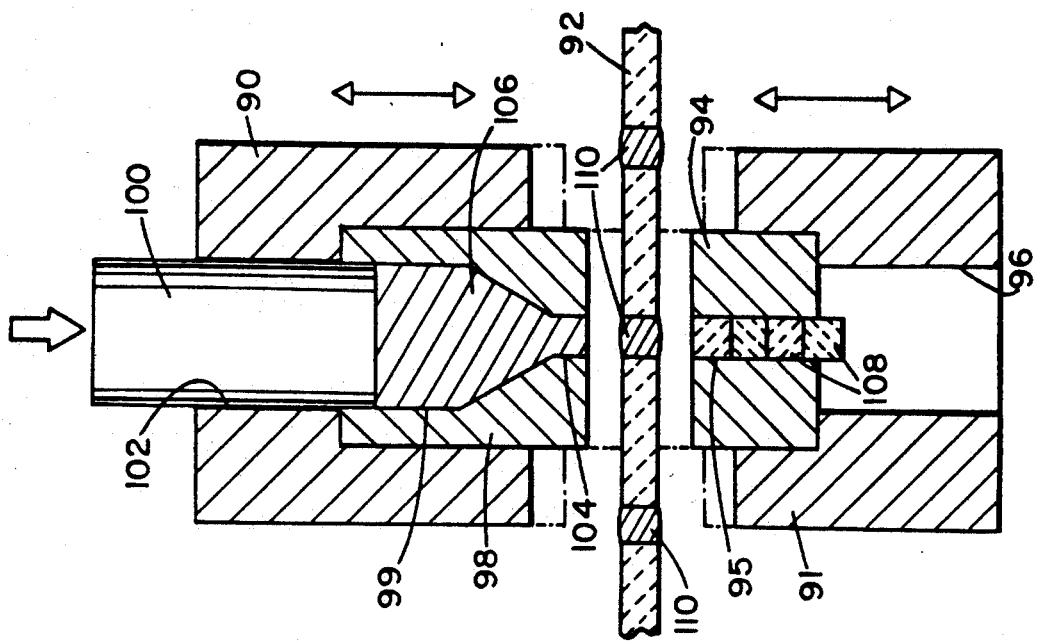
FIG. 5 is a view similar to FIG. 3 illustrating a third embodiment of the invention.

FIG. 5 illustrates another alternative embodiment in which filled via holes are formed one at a time rather than simultaneously. In this embodiment, upper and lower opposing injection and base members 90, 91 are supported on opposite sides of ceramic sheet or tape 92. The members are moveable inwardly and outwardly in the direction of the arrows between an operative position in which a portion of the sheet 92 is clamped between the members, and a released position in which the members are spaced from the sheet, as illustrated in FIG. 5. The sheet itself is supported on a suitable transport mechanism, such as an X-Y table or frame as is used in a conventional laser or mechanical punch tool, which is driven via a suitable X-Y plotter drive of a conventional type controlled by a suitably programmed computer to position successive points on the sheet between the injection and base members, corresponding to the desired via hole pattern.

A lower die 94 having a single hole 95 of predetermined via dimensions is supported on base member 91, which has a through bore 96 below die 94. The upper injection member has a through bore of stepped diameter, with an upper die 98 secured in the larger diameter, lower end 99 of the bore and a plunger or punch 100 slidably mounted in the smaller diameter, upper end 102 of the bore. The upper die 99 has a hole 104 at its lower end aligned with hole 95 in the lower die and communicating with internal injection chamber 106 which contains conductive ink material. The upper end of injection chamber 106 is open to receive plunger 100 when the mechanism is activated.

In operation, the sheet 92 is first moved by the drive mechanism with the injection and base members spaced apart as in FIG. 5 until a predetermined position on the sheet is located between the opposing dies 94 and 98. The sheet is held stationary in this position while the members 90 and 91 are moved inwardly to clamp the sheet between the dies. A suitable mechanism such as an hydraulic punch or press is activated to force the plunger 100 downwardly into injection chamber 106, forcing ink out of the chamber through the hole 99 at the lower end of the chamber. The ink in turn acts as a punch to punch or extrude out a plug 108 of ceramic material into the aligned hole 95 in the lower die 94, replacing the extruded plug with ink to form a filled via hole 110. The members 90 and 91 are then moved outwardly away from the sheet, and the sheet is moved by the transport mechanism to the next programmed position, where the procedure is repeated to form another filled via hole. The procedure is continued until filled via holes have been formed in a predetermined pattern on the sheet, at which point it is removed and the next ceramic sheet is processed in the same way. The extruded via plugs 108 will collect in bore 96 and can be discarded. The tooling in this embodiment is similar to that of standard laser or mechanical hole punching equipment, except that the laser or mechanical punch is replaced with the opposing die set and ink injection chamber and injection plunger, and that filled via holes are formed, rather than simple empty cavities or holes. Filled via holes may be formed at a rate of up to 20 per second with this apparatus, and less pressure will be needed to force the ink through the ceramic sheet in this embodiment than in the previous two embodiments, where a plurality of filled holes were formed simultaneously.

In all of the above embodiments, a single machine or apparatus only is needed to form and fill via holes, rather than two separate procedures and machines as in the past. Additionally, the holes are formed and filled with greater accuracy, since the ink itself forces out the plug of ceramic and thus completely fills the resultant hole.

Although some preferred embodiments of the present invention have been described above by way of example only, it will be understood by those skilled in the field that modifications may be made to the disclosed embodiments without departing from the scope of the invention, which is defined by the appended claims.

We claim:

1. A method of forming filled via holes in a flat wafer, comprising the steps of:

placing a wafer having no preformed via holes between a pair of dies each having at least one hole aligned with the hole in the other die with wafer material located between the aligned holes;

clamping a pair of opposing members together with the dies and wafer between the members, one of the members having an injection chamber containing conductive ink material connected to the hole in one of the dies; and forcing high viscosity conductive ink material out of the injection chamber through the hole in said one die to punch a plug of wafer material out of the wafer and into the aligned hole in the underlying die and replace the plug with conductive ink material.

2. The method as claimed in claim 1, wherein the step of forcing ink material out of the injection chamber comprises pressing down a plunger in the chamber to force ink material outwardly through the hole in the die.

3. The method as claimed in claim 1, wherein the step of forcing ink material out of the chamber comprises forcing ink simultaneously through a plurality of holes in a predetermined pattern in said one die and punching plugs of wafer material into aligned holes in the other die and replacing each plug with conductive ink material.

4. The method as claimed in claim 1, wherein the step of forcing ink material out of the injection chamber comprises forcing ink material through a single hole in said one die to punch a plug of wafer material into a single aligned hole in the other die and replacing the plug with conductive ink material.

5. The method as claimed in claim 4, wherein a predetermined position on the wafer is positioned between the members prior to the clamping step, and after an ink filled hole has been formed at that position, the members are released and the wafer is moved until another predetermined position is located between the members, the members are again clamped together and ink is forced through the hole in the first die to form an ink filled hole in the wafer at that position, the successive steps being repeated until a plurality of ink filled holes have been formed in a predetermined pattern across the wafer.

* * * * *